(12) United States Patent
Kapon et al.

(10) Patent No.: US 6,828,168 B2
(45) Date of Patent: Dec. 7, 2004

(54) METHOD OF FABRICATION OF A MICRO-ELECTROMECHANICALLY TUNABLE VERTICAL CAVITY PHOTONIC DEVICE

(75) Inventors: Elyahou Kapon, Lausanne (CH); Vladimir Iakovlev, Ecublens (CH); Alexei Sirbu, Ecublens (CH); Alok Rudra, Blonay (CH); Grigore Suruceanu, Ecublens (CH)

(73) Assignee: Ecole Polytechnique Federale de Lausanne, Lausanne (CH)

( * ) Notice: Subject to any disclaimer, the term of this patent is extended or adjusted under 35 U.S.C. 154(b) by 0 days.

(21) Appl. No.: 10/382,374

(22) Filed: Mar. 6, 2003

(65) Prior Publication Data

US 2003/0169786 A1 Sep. 11, 2003

Related U.S. Application Data

(62) Division of application No. 09/809,236, filed as application No. PCT/IB02/00682 on Mar. 8, 2002, now Pat. No. 6,546,029.

(51) Int. Cl.$^7$ ............................................. H01L 21/00
(52) U.S. Cl. ............................ 438/22; 438/28; 438/39; 372/20
(58) Field of Search .......................... 438/22, 28, 39; 372/20

(56) References Cited

U.S. PATENT DOCUMENTS

| | | | | | |
|---|---|---|---|---|---|
| 5,991,326 | A | * | 11/1999 | Yuen et al. | 372/96 |
| 6,324,192 | B1 | * | 11/2001 | Tayebati | 372/20 |
| 6,438,149 | B1 | * | 8/2002 | Tayebati et al. | 372/45 |
| 6,546,029 | B2 | * | 4/2003 | Sirbu et al. | 372/20 |

* cited by examiner

*Primary Examiner*—George Fourson
*Assistant Examiner*—Fernando L. Toledo
(74) *Attorney, Agent, or Firm*—Moetteli & Assoc.; John Moetteli

(57) ABSTRACT

A tunable Fabry-Perot vertical cavity photonic device and a method of its fabrication are presented. The device comprises top and bottom semiconductor DBR stacks and a tunable air-gap cavity therebetween. The air-gap cavity is formed within a recess in a spacer above the bottom DBR stack. The top DBR stack is carried by a supporting structure in a region thereof located above a central region of the recess, while a region of the supporting structure above the recess and outside the DBR stack presents a membrane deflectable by the application of a tuning voltage to the device contacts.

34 Claims, 5 Drawing Sheets

METHOD OF FABRICATION OF A MICRO-ELECTROMECHANICALLY TUNABLE VERTICAL CAVITY PHOTONIC DEVICE

CROSS-REFERENCE TO RELATED APPLICATIONS

This application is a divisional application of PCT/IB02/00682, filed on Mar. 8, 2002 and U.S. Ser. No 09/809,236, filed on Mar. 15, 2001, now U.S. Pat. No. 6,546,029, all of the same title, the applications having common inventors, and the contents of which being incorporated herein by reference thereto. Priority under 35 U.S.C. §119 is claimed to these prior applications.

FIELD OF THE INVENTION

The present invention is generally in the field of semiconductor optoelectronic devices, and relates to micro-electromechanically tunable vertical cavity photonic devices, such as filters and lasers, and a method of their fabrication.

BACKGROUND OF THE INVENTION

Tunable optical filters and tunable Vertical Cavity Surface Emitting Lasers (VCSELs) based on micro-electromechanical Fabry-Perot filter technology have recently generated considerable interest in the art. This is due to the fact that these devices present low cost alternatives to standard tunable filters, lasers and photodetectors which normally are high cost components, and for this reason, cannot be used in emerging wavelength division-multiplexing (WDM) local area networks systems which are very cost sensitive.

A micro-electromechanical tunable vertical cavity device operating in a specific wavelength range represents a Fabry-Perot cavity formed between two distributed Bragg reflectors (DBRs) that have high reflectivity values in this specific wavelength range. The Fabry-Perot cavity incorporates a tunable air gap cavity with a thickness of about a number of half-wavelengths. Normally, the top DBR is suspended on a micro-mechanical cantilever (or a number of micro-beams) above the air gap and can be deflected by changing the electric field in the air-gap cavity. This changes the wavelength of resonance of the Fabry-Perot cavity. The higher the reflectivity of the DBRs, the narrower the linewidth of the transmission wavelength in a tunable filter. Lower threshold gain and higher selectivity are achieved, respectively, in tunable VCSELs and resonant photodetectors.

Semiconductor based DBRs, which have low optical absorption, good thermal conductivity and reflectivity values in excess of 99.5%, are widely used in the art for the fabrication of different types of micro-electromechanically tunable vertical cavity devices.

U.S. Pat. No. 5,771,253* discloses a tunable VCSEL device based on the micro-electromechanical Fabry-Perot filter technology which comprises an electrically deflectable cantilever, a top and bottom DBR and a multiquantum well (MQW) region. The MQW well region is situated between a bottom DBR and a top reflector consisting of a partial DBR situated on top of the MQW, an air-gap and a moveable DBR situated on the cantilever. An oxide layer is situated in the partial DBR to provide lateral electrical and optical confinement in the active region.

The article "Widely and continuously tunable micromachined resonator cavity detector with wavelength tracking"* M. S. Wu, E. S. Vail, G. S. Li, W. Yuen and C. J. Chang-Hasnain, IEEE Photon. Technol. Lett., 8, (1996), No 1, pp. 98–100, discloses a tunable photodetector based on the micro-electromechanical Fabry-Perot filter technology which comprises an electrically deflectable cantilever, top and bottom DBR stacks and a photodetector region situated between top and bottom DBRs.

The article "GaAs Micromachined Widely Tunable Fabry-Perot Filters",* E. C. Vail et al., Electronics Letters Online, Vol. 31, No. 3, 1995, pp. 228–229, discloses a process of fabrication of a tunable optical filter of the kind specified. First, a monolithic structure is formed consisting of top and bottom DBRs separated by a sacrificial layer. Then, the top DBR is structured by etching it completely in unmasked regions until reaching the sacrificial layer. This process is followed by selectively etching the sacrificial layer in unmasked regions and under the top DBR and supporting cantilever. This results in that the top DBR is suspended above the bottom DBR and in an air gap between the top and bottom DBRs having a thickness approximately equal to the thickness of the sacrificial layer. The remaining part of the sacrificial layer fixes the cantilever at its base.

All cantilever-based devices have a complex fabrication process and are mechanically unstable, which results in a low fabrication yield. These devices are also difficult to optimize: if the cantilever is longer than 100 μm, the mechanical instability drastically increases. In case of shorter cantilevers, the flexibility is reduced, resulting in the necessity to decrease their thickness. This results in the reduction of the number of pairs in the top DBR stack, and consequently, in inferior device parameters.

A different technique of fabrication of an electrically tunable optical filter is disclosed in U.S. Pat. No. 5,739,945 and in the article "Widely Tunable Fabry-Perot Filter Using Ga(Al)As—AlO$_x$ Deformable Mirrors"*, P. Tayebati et al., IEEE Photonics Technology Letters, Vol. 10, No. 3, 1998, pp. 394–396. According to this technique, the low index AlGaAs layers of a conventional mirror stack consisting of GaAs and AlGaAs layers is substituted with oxidized AlGaAs layers or air gaps. Although this technique provides quite good results, i.e., the tuning range of 70 nm around 1.5 μm was obtained by applying a voltage of 50V, the fabrication process is very complex and the device structure obtained with this technique is even more mechanically unstable than standard cantilever-type devices.

SUMMARY OF THE INVENTION

There is accordingly a need in the art to improve micro-electromechanically tunable vertical cavity photonic devices by providing a novel device structure and fabrication method.

The main idea of the present invention consists in replacing cantilevers and beams which support top DBRs in the prior art devices of the kind specified by a membrane, which completely covers an air-gap cavity and carries the top DBR stack, which is situated in the center of the membrane. The air-gap is incorporated in an etched-through recess in a spacer which is blocking the current flow when applying a voltage to the device contacts to deflect the membrane. Membrane deflection results in tuning the air-gap cavity and, as a consequence, the resonance wavelength of the device.

The above is implemented in the following manner: First, the surface of a spacer is structured by etching a recess through it. Then, a supporting structure, on which a DBR is located, is bonded to the structured surface of the spacer. This is followed by etching the DBR till reaching the supporting region, thereby forming a mesa of the top DBR stack. The mesa is centered around a vertical axis passing through the center of the recess and has the lateral dimension less than that of the recess. A region of the supporting structure outside the top DBR stack (mesa) and above the recess presents the membrane.

The membrane is, on the one hand, very flexible (having the thickness of about 1 $\mu$m), and, on the other hand, is continuous in the lateral direction, and is therefore mechanically stable, resulting in a high fabrication yield. The top DBR can be made of a large number of layers without affecting the flexibility of the is membrane and providing a narrow linewidth of transmitted light. By forming an island of high refractive index material in the way of the optical beam inside the optical cavity of the device, the position of the beam during the tuning process is stabilized.

Thus, according to one aspect of the present invention, there is provided a Fabry-Perot tunable vertical cavity device comprising top and bottom semiconductor DBR stacks separated by a tunable air-gap cavity and a supporting structure that carries the top DBR stack, wherein the air-gap cavity is located within a recess formed in a spacer completely covered by the supporting structure, the top DBR stack being centered around a vertical axis passing through the center of said recess and having a lateral dimension smaller than the lateral dimension of the recess, a region of the supporting structure above the recess and outside the top DBR stack presenting a membrane to be deflected by application of a tuning voltage to electrical contacts of the device.

According to another aspect of the present invention, there is provided a method of fabrication of a Fabry-Perot tunable vertical cavity device comprising top and bottom DBR stacks with a tunable air-gap cavity therebetween, the method comprising the steps of:

(i) forming a spacer above the bottom DBR stack;
(ii) fabricating an etched-through recess in the spacer, thereby forming a structured surface of the spacer, said recess presenting a location for said tunable air-gap cavity;
(iii) bonding a top DBR wafer including a supporting structure to the structured surface of the spacer in such a way that said supporting structure faces said structured surface of the spacer and completely covers said recess, thus forming the air-gap cavity, and selectively etching a substrate on which layers of the top DBR were grown;
(iv) forming the top DBR stack above a central region of said recess and a membrane above said recess outside said top DBR stack, by etching the layers of the top DBR till reaching the supporting structure so as to define a mesa presenting said top DBR stack having a lateral dimension smaller than the lateral dimension of said recess and being centered about a vertical axis passing through the center of said recess, a region of the supporting structure above said recess and outside said mesa presenting said membrane deflectable by application of a tuning voltage to electrical contacts of the device.

In order to confine the optical mode of transmitted or emitted light, a mesa can be formed on the bottom of the recess being centered around the vertical axis passing through the center of the recess and having the lateral size of less than 10 and height of less than 1/30 of the device operation wavelength.

The spacer region can be placed on top of the bottom DBR, in which case the device presents a tunable optical filter. In the case of tunable VCSELs and tunable resonant photodetectors, an active cavity material is placed between the spacer and the bottom DBR.

The top DBR stack may comprise pairs of layers of $Al_xGa_{1-x}As$ with different values of x, and the supporting structure and the bottom DBR stack may also comprise the same pairs of layers as in the top DBR stack. The spacer may comprise layers with alternating n-type and p-type doping. In the case of the tunable filter, the spacer may comprise the same pairs of layers as in the bottom DBR with alternating n- and p-type doping. In the case of tunable VCSELs and tunable resonant photodetectors, the spacer may comprise layers grown in the same material system as layers in the active cavity material stack with alternating n- and p-type doping.

BRIEF DESCRIPTION OF THE DRAWINGS

In order to understand the invention and to see how it may be carried out in practice, several embodiments will now be described, by way of non-limiting examples only, with reference to the accompanying drawings, in which.

DETAILED DESCRIPTION OF THE INVENTION

Figure 1:
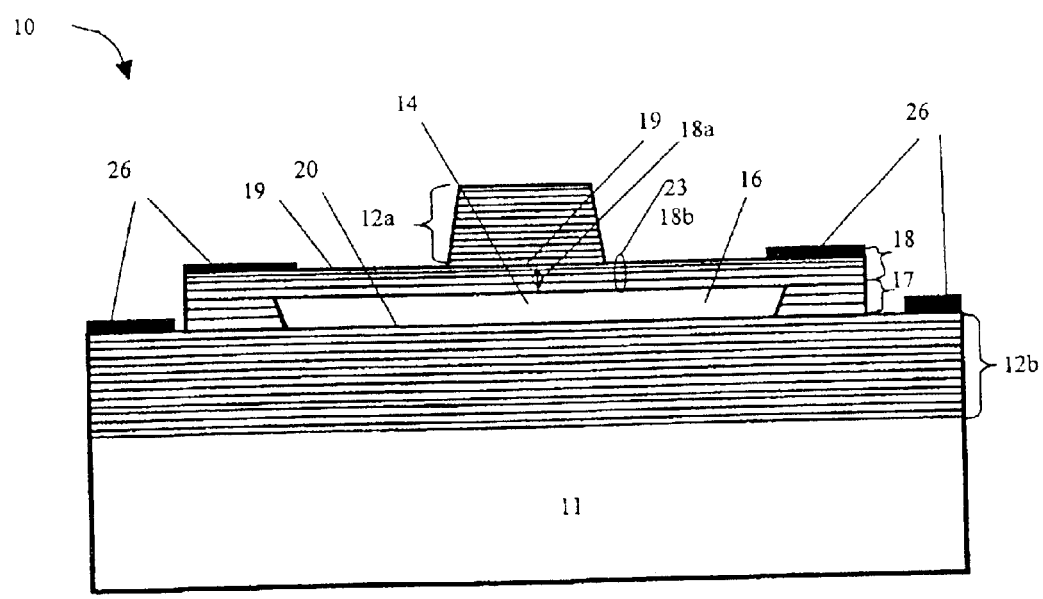
FIG. 1 illustrates an example of a tunable optical filter device according to the present invention.

Referring to FIG. 1, there is schematically illustrated a tunable vertical cavity device, generally designated 10, constructed according to one embodiment of the present invention. The device 10 is designed like a Fabry-Perot vertical cavity based device, having two semiconductor DBRs 12a and 12b, and an air-gap cavity 14 therebetween, and presents a tunable optical filter. The air-gap cavity 14 is located within an etched-through recess 16 formed in a spacer 17, which is located on top of the bottom DBR 12b and is completely covered by a supporting structure 18, which carries the top DBR stack 12a. The top DBR stack 12a is located on a region 18a of the supporting structure 18 so as to be centered around a vertical axis passing through the center of the recess 16. The top DBR stack 12a has a lateral dimension smaller than that of the recess 16. A region 18b of the supporting structure outside the region 18a (carrying the top DBR stack 12a) presents a membrane 23 deformable by the application of a tuning voltage to the device contacts 26.

In the present example, the bottom DBR 12b comprises 30 pairs of AlGaAs/GaAs n-type layers grown on a n-type GaAs substrate and having the reflectivity of 99.5% at 1.55 $\mu$m. The spacer 17 is a stack of six pairs of AlGaAs/GaAs layers with the same thickness and composition values as in the bottom DBR stack 12b. In distinction to the layer structure of the bottom DBR stack, the layers in the spacer 17 have alternating n-type and p-type doping. The recess 16 with a lateral dimension of 300×300 $\mu m^2$ is made by etching all six layers of the spacer 17, such that the depth of the recess 16 is equal to about 1.5 $\mu$m, which defines the thickness of the air-gap cavity 14, and the bottom surface 20 of the recess 16 coincides with the top of the bottom DBR stack 12b.

The top DBR stack 12a is a mesa containing 25 pairs of AlGaAs/GaAs layers, and having the reflectivity of 99.7% and the lateral dimension of 80×80 $\mu m^2$. The top DBR stack 12a is located on the supporting structure 18 (within the region 18a thereof), which consists of 4 pairs of AlGaAs/GaAs layers with the same thickness and composition as the layers in the top DBR stack 12a, and terminates with a InGaP etch-stop layer 19. The layer 19 has the thickness of 30 nm and is located at the interface between the top DBR 12a and the supporting structure 18. The lateral continuation of the supporting structure 18 within the region 18b thereof (outside the region 18a) forms the membrane 23 which completely covers the recess 16.

Figure 2:
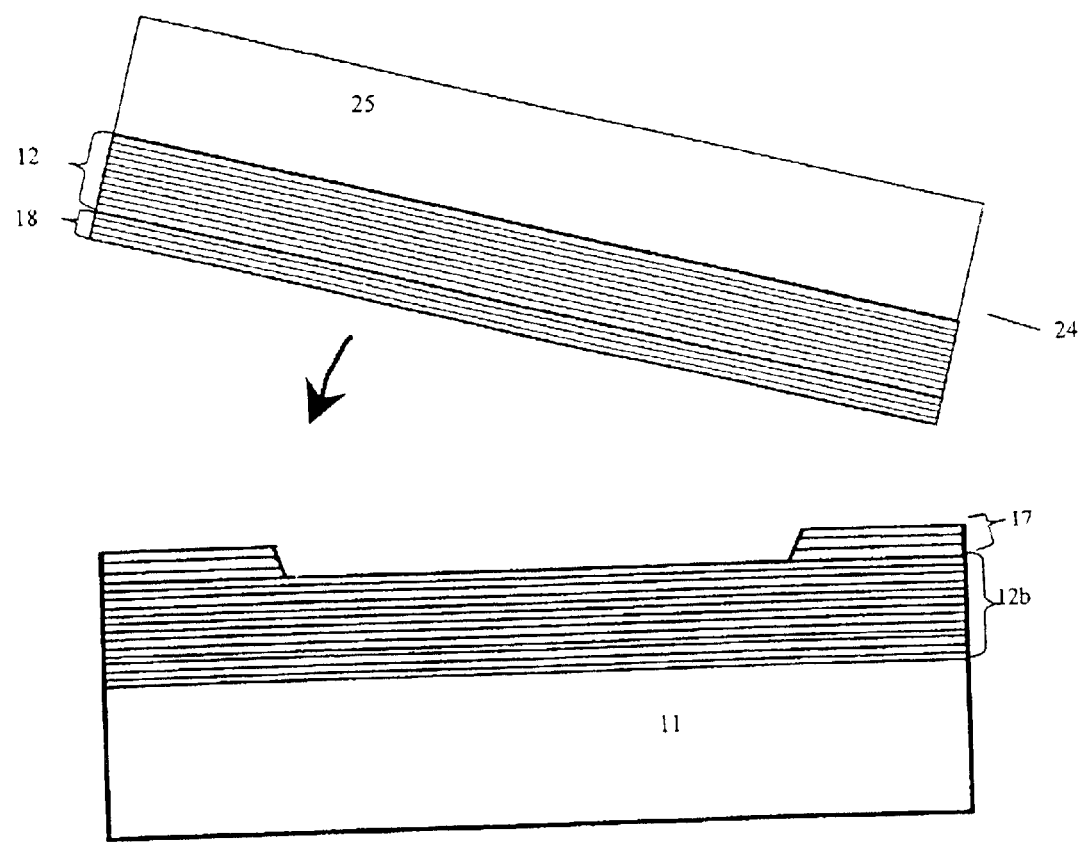
FIG. 2 illustrates the fabrication of the filter device of FIG. 1.

The fabrication of the filter device 10 will now be described with reference to FIG. 2.

In the first step, the etched-through recess 16 with the lateral size of 300×300 $\mu m^2$ is formed in the spacer 17 (consisting of a stack of six pairs of AlGaAs/GaAs layers with alternating n-type and p-type doping) by reactive plasma dry etching in $Cl_2$—$CH_4$—Ar and selective chemical etching in a HF—$H_2O$ solution. This procedure allows to precisely stop the etching, when reaching the top GaAs layer of the bottom AlGaAs/GaAs DBR stack 12b (grown on a substrate 11), which results in the recess depth of about 1.5 $\mu m$.

In the second step, a wafer fusion is applied between the surface of the supporting structure 18 of a top DBR wafer 24 and the structured surface of the spacer 17. The top DBR wafer 24 contains a DBR 12 (in which the top DBR 12a is then formed) grown on a GaAs substrate 25, and the supporting structure 18 grown on top of the DBR 12. Hence, the surface of the supporting structure 18 is fused face to face with the structured surface of the spacer 17 forming a fused interface within a surface region of the spacer 17 outside the recess. The fusion is performed at 650° C. by applying a pressure of 2 bar to the fused interface. Thereafter, although not specifically shown here, the GaAs-substrate 25 is selectively etched in a $H_2O_2$—$NH_3OH$ solution till reaching the first AlGaAs layer of the DBR structure 12 (i.e., bottom layer of the structure 12 bonded to the spacer), which acts as an etch-stop layer and which is also selectively etched in a HF—$H_2O$ solution.

In the third step, a mesa is etched in the DBR 12 by dry etching in $Cl_2$—$CH_4$—Ar and selective chemical etching in a HF—$H_2O$ solution till reaching the etch stop-layer 19 to form the top DBR stack 12a (FIG. 1), which is centered around a vertical axis passing through the center of the recess 16 and has the lateral dimension of 80×80 $\mu m^2$. As a result of this etching, the membrane 23 is formed as the lateral continuation of the supporting structure 18 (its region 18b) completely covering the recess 16. By this, the air-gap cavity 14 is formed being confined at its bottom side by the top surface of the bottom DBR stack 12b and at its top side by the supporting structure 18. The device fabrication is completed by forming the electrical contacts 26.

In the present example, the spacer structure 17 and the supporting structure 18 are made of pairs of GaAs/AlGaAs layers. It should, however, be noted that these structures, as well as those of the DBR stacks, can also be made of GaAs, or other types of dielectric layers. In order to stabilize the transmitted optical mode, a mesa can be formed on the bottom of the recess 16 being centered around the vertical axis passing through the center of the recess and having the lateral size of less than 10 and height of less than 1/30 of the device operation wavelength.

Figure 3:
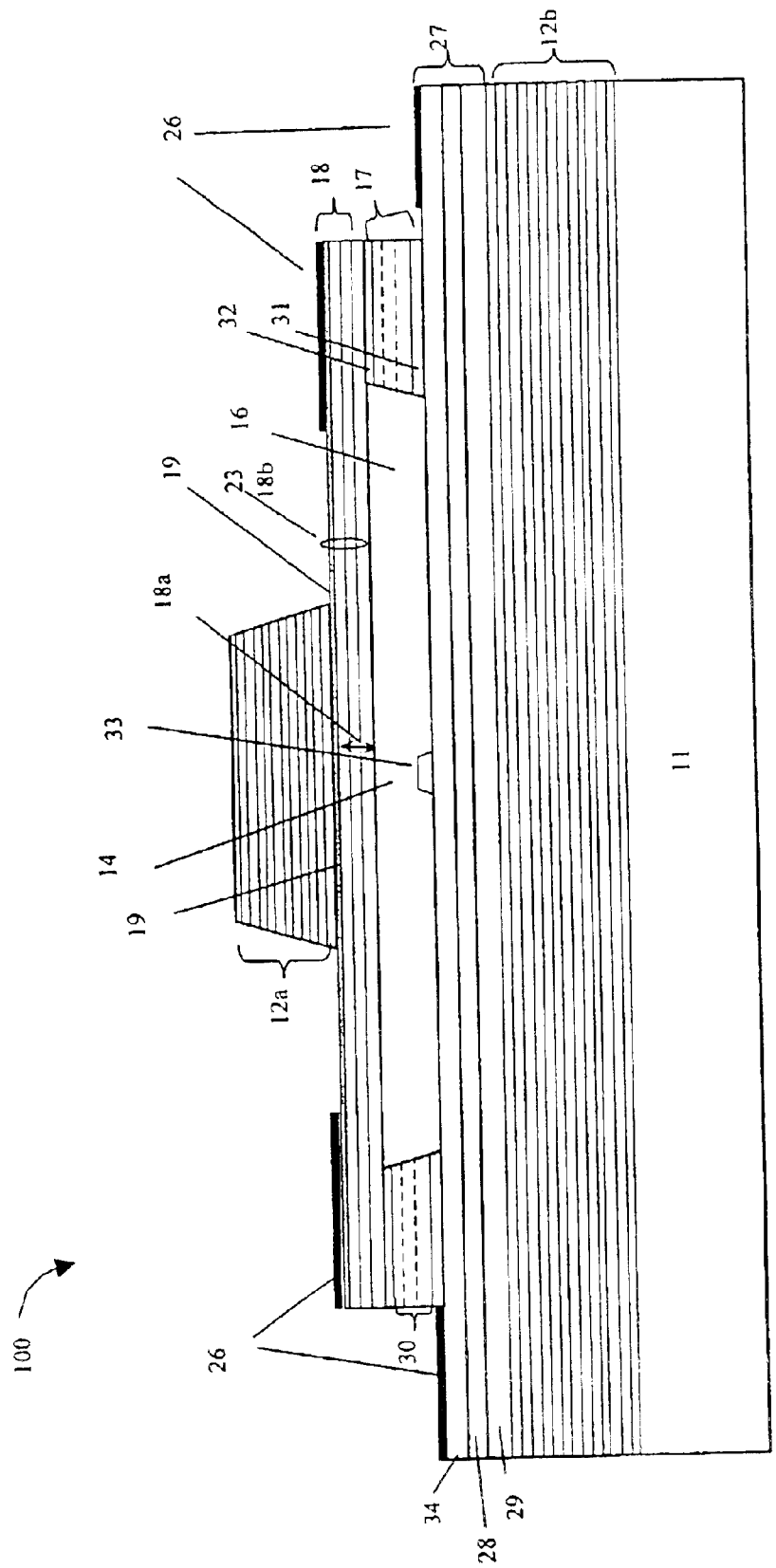
FIG. 3 illustrates an example of a tunable VCSEL device according to the present invention.

Referring to FIG. 3, there is illustrated a tunable vertical cavity device 100 according to another embodiment of the present invention presenting a VCSEL device structure. This device is designed to emit light in the vicinity of 1.55 $\mu m$. To facilitate understanding, the same reference numbers are used for identifying those components, which are identical in the devices 10 and 100. Similar to the device 10 of the previous example, the device 100 is designed like a tunable Fabry-Perot cavity having top and bottom DBRs 12a and 12b, respectively, with maximum reflectivity at 1.55 $\mu m$. In distinction to the previously described device 10, in the device 100, the spacer 17 is placed on the top of an active cavity material 27, which is fused to the surface of the AlGaAs/GaAs bottom DBR stack 12b.

The active cavity material 27 comprises a multiquantum well InGaAsP/InGaAs layer stack 28, which has a maximum of photoluminescence emission at 1.55 $\mu m$ and is sandwiched between two InP cladding layers 29 and 34. The optical thickness of the active cavity material is equal to 3/2×1.55 $\mu m$. The spacer 17 has a total thickness of 1.51 $\mu m$ and comprises a InP layer 30 with alternating p-n-p-n doping sandwiched between 2 InGaAsP etch-stop layers 31 and 32. The spacer 17 is grown in the same process with the active cavity material 27. A mesa 33 made of InGaAsP and having the maximum of photoluminescence ($PL_{max}$) at 1.41 $\mu m$ is located on the bottom of the recess 16 and centered about a central vertical axis passing through the center of the recess 16.

The device 100 may be pumped optically with 980 nm pump light, for example, through the top DBR 12a, resulting in an emission at 1.55 $\mu m$ through the bottom DBR 12b and the GaAs substrate 11. Applying a voltage between contacts 26 results in a deflection of the membrane 23 towards the bottom of the recess 16, which shortens the air-gap cavity 14 and correspondingly, the emission wavelength of the VCSEL device as well. The mesa 33 introduces a lateral refractive index variation in the optical cavity allowing to stabilize the optical mode. The height and the lateral size of the mesa 33 should be set less than 1/30 and less than 10, respectively, of the device operation wavelength.

Figure 4:
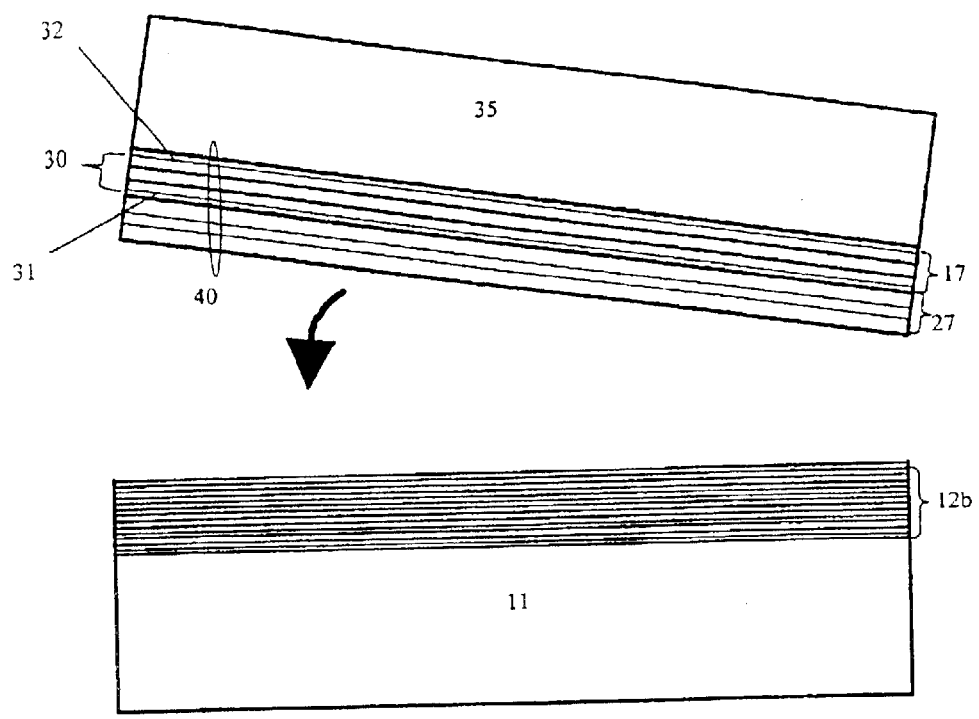
FIGS. 4 and 5 illustrate the fabrication of the tunable VCSEL device of FIG. 3.
Figure 5:
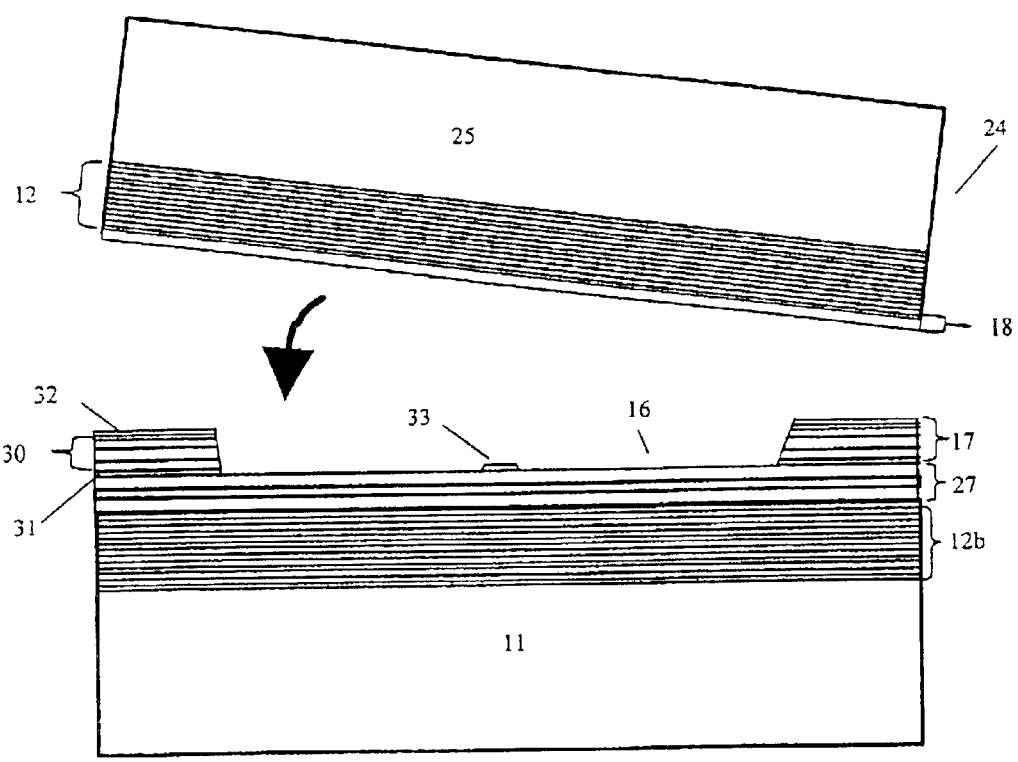

The fabrication of the tunable VCSEL device 100 will now be described with reference to FIGS. 4 and 5.

First, a multilayer stack structure 40 is grown on a InP substrate 35. The structure 40 comprises the spacer 17 and the active cavity material 27. The spacer 17 has the total thickness of 1.5 $\mu m$ and includes an InP layer 30 with alternating p-n-p-n doping sandwiched between two etch stop InGaAsAP layers, both with $PL_{max}$=1.4 $\mu m$ and thickness of 50 nm. The active cavity material 27 has the total thickness of 725 nm and comprises 6 quantum wells sandwiched between two InP cladding layers.

Then, the fusion of the multilayer stack 40 with the bottom DBR stack 12b is performed by putting them face to face in a forming gas ambient, increasing the temperature to 650° C., and applying a pressure of about 2 bar to the fused interface. This process is followed by selective etching of the InP substrate 35 in a HCl—$H_2O$ solution till reaching the InGaAsP etch-stop layer 32 to form the recess 16. More specifically, the selective etching consists of the following: The InGaAsP etch-stop layer 32 is first etched in an $H_2SO_4$—$H_2O_2$—$H_2O$ solution, and then the InP layer 30 is etched in a HCl—$H_2O$ solution. Thereafter, the mesa 33 is formed by etching in a $H_2SO_4$—$H_2O_2$—$H_2O$ solution.

In the next step, the structured surface of the spacer 17 is fused to the substantially planar surface of the supporting structure 18. The fusion is performed at 650° C. applying a pressure of 2 bar to the fused interface. This is followed by selective etching of the GaAs substrate 25 of the top DBR wafer 24, and by etching the DBR 12 as described above with respect to the fabrication of the device 10 to form the mesa 12a. The device fabrication is completed by forming the electrical contacts 26.

Those skilled in the art will readily appreciate that various modifications and changes can be applied, to the preferred embodiment of the invention as hereinbefore exemplified without departing from its scope defined in and by the appended claims. Note that the publications designated with an astrick* are incorporated herein by reference thereto.

What is claimed is:

1. A method of fabrication of a Fabry-Perot tunable vertical cavity device comprising first and second distributed Bragg reflector (DBR) stacks with a tunable air-gap cavity therebetween, the method comprising the steps of:
   (a) forming a spacer above the first DBR stack, wherein said spacer has a structured surface formed by a recess presenting a location for the tunable air-gap cavity;
   (b) providing a second DBR structure and coupling it to the structured surface of the spacer so as to completely cover said recess by said second DBR structure, thus forming the air-gap cavity between the first DBR stack and the second DBR structure, and;
   (c) selectively applying material removal to the second DBR structure to form a mesa, presenting the second DBR stack, above a region of said recess, and to form a membrane above said recess outside said second DBR stack, wherein said second DBR structure comprises a supporting structure carrying a layer structure of the second DBR stack, wherein the lateral continuation of the supporting structure within a region thereof outside the region below the mesa forms the membrane completely covering the recess, wherein the thickness of the membrane is about 0.5–1.5 micron.

2. A method of fabrication of a Fabry-Perot tunable vertical cavity device comprising first and second distributed Bragg reflector (DBR) stacks with a tunable air-gap cavity therebetween, the method comprising the steps of:
   (a) forming a spacer above the first DBR stack, wherein said spacer has a structured surface formed by a recess presenting a location for the tunable air-gap cavity;
   (b) providing a second DBR structure and coupling it to the structured surface of the spacer so as to completely cover said recess by said second DBR structure, thus forming the air-gap cavity between the first DBR stack and the second DBR structure, and;
   (c) selectively applying material removal to the second DBR structure to form a mesa, presenting the second DBR stack, above a region of said recess, and to form a membrane above said recess outside said second DBR stack,
   wherein said second DBR structure comprises a supporting structure carrying a layer structure of the second DBR stack, wherein the second DBR stack is coupled to the structure of the spacer by applying a wafer fusion between the surface of the supporting structure of the second DBR structure and the structured surface of the spacer.

3. A method of fabrication of a Fabry-Perot tunable vertical cavity device comprising first and second distributed Bragg reflector (DBR) stacks with a tunable air-gap cavity therebetween, the method comprising the steps of:
   (a) forming a spacer above the first DBR stack, wherein said spacer has a structured surface formed by a recess presenting a location for the tunable air-gap cavity;
   (b) providing a second DBR structure and coupling it to the structured surface of the spacer so as to completely cover said recess by said second DBR structure, thus forming the air-gap cavity between the first DBR stack and the second DBR structure, and;
   (c) selectively applying material removal to the second DBR structure to form a mesa, presenting the second DBR stack, above a region of said recess, and to form a membrane above said recess outside said second DBR stack, comprising formation of a mesa on the bottom of said recess.

4. The method according to claim 3, wherein said mesa on the bottom of the recess is centered about the central vertical axis passing through the center of the recess.

5. The method according to claim 3, wherein said mesa on the bottom of the recess has a lateral size and a height of less than 10 and less than $\frac{1}{30}$, respectively, of a certain wavelength selected as an operational wavelength of the device.

6. A method of fabrication of a Fabry-Perot tunable vertical cavity device comprising first and second distributed Bragg reflector (DBR) stacks with a tunable air-gap cavity therebetween, the method comprising the steps of:
   (a) forming a spacer above the first DBR stack, wherein said spacer has a structured surface formed by a recess presenting a location for the tunable air-gap cavity;
   (b) providing a second DBR structure and coupling it to the structured surface of the spacer so as to completely cover said recess by said second DBR structure, thus forming the air-gap cavity between the first DBR stack and the second DBR structure, and;
   (c) selectively applying material removal to the second DBR structure to form a mesa, presenting the second DBR stack, above a region of said recess, and to form a membrane above said recess outside said second DBR stack, comprising formation of an active cavity material between the first DBR stack and the spacer.

7. The method according to claim 6, wherein the formation of the active cavity material comprises the steps of growing a multiquantum well layer stack sandwiched between two cladding layers.

8. The method according to claim 6, wherein said active cavity material is fused to the surface of the first DBR stack.

9. A method of fabrication of a Fabry-Perot tunable vertical cavity device comprising first and second distributed Bragg reflector (DBR) stacks with a tunable air-gap cavity therebetween, the method comprising the steps of:
   (a) forming a spacer above the first DBR stack, wherein said spacer has a structured surface formed by a recess presenting a location for the tunable air-gap cavity;
   (b) providing a second DBR structure and coupling it to the structured surface of the spacer so as to completely cover said recess by said second DBR structure, thus forming the air-gap cavity between the first DBR stack and the second DBR structure, and;
   (c) selectively applying material removal to the second DBR structure to form a mesa, presenting the second DBR stack, above a region of said recess, and to form a membrane above said recess outside said second DBR stack, wherein the spacer is a stack formed by layers having the same thickness and composition values as in the first DBR stack.

10. The method according to claim 9, wherein the layers in the spacer have alternating n-type and p-type doping.

11. The method according to claim 1, wherein the second DBR stack comprises $Al_xGa_{1-x}As$ layers with different values of x.

12. The method according to claim 1, wherein the supporting structure comprises pairs of $Al_xGa_{1-x}As$ layers with different values of x.

13. The method according to claim 12, wherein the supporting structure comprises the same pairs of $Al_xGa_{1-x}As$ layers as the second DBR stack.

14. The method according to claim 1, wherein each of the first and second DBR stacks comprises pairs of $Al_xGa_{1-x}As$ layers with different values of x.

15. The method according to claim 12, wherein the second DBR structure comprises an etch stop layer presenting an interface between the second DBR stack and the supporting structure.

16. The method according to claim 12, wherein said etch stop layer is an InGaP layer.

17. A method of fabrication of a Fabry-Perot tunable vertical cavity device comprising first and second distributed Bragg reflector (DBR) stacks with a tunable air-gap cavity therebetween, the method comprising the steps of:
   (a) forming a spacer above the first DBR stack, wherein said spacer has a structured surface formed by a recess presenting a location for the tunable air-gap cavity;
   (b) providing a second DBR structure and coupling it to the structured surface of the spacer so as to completely cover said recess by said second DBR structure, thus forming the air-gap cavity between the first DBR stack and the second DBR structure, and;
   (c) selectively applying material removal to the second DBR structure to form a mesa, presenting the second DBR stack, above a region of said recess, and to form a membrane above said recess outside said second DBR stack, wherein the first DBR stack comprises 30 pairs of AlGaAs/GaAs n-type layers grown on an n-type GaAs substance.

18. The method according to claim 17, wherein said spacer is a stack having six pairs of AlGaAs/GaAs layers with alternating n-type and p-type doping.

19. The method according to claim 18, wherein said recess is formed in the spacer by reactive plasma dry etching in $Cl_2$—$CH_4$—Ar and selective chemical etching in a HF—$H_2O$ solution.

20. The method according to claim 19, wherein the etching is stopped, when reaching the top GaAs layer of the first AlGaAs/GaAs DBR stack.

21. A method of fabrication of a Fabry-Perot tunable vertical cavity device comprising first and second distributed Bragg reflector (DBR) stacks with a tunable air-gap cavity therebetween, the method comprising the steps of:
   (a) forming a spacer above the first DBR stack, wherein said spacer has a structured surface formed by a recess presenting a location for the tunable air-gap cavity;
   (b) providing a second DBR structure and coupling it to the structured surface of the spacer so as to completely cover said recess by said second DBR structure, thus forming the air-gap cavity between the first DBR stack and the second DBR structure, and;
   (c) selectively applying material removal to the second DBR structure to form a mesa, presenting the second DBR stack, above a region of said recess, and to form a membrane above said recess outside said second DBR stack, wherein the second DBR structure contains a GaAs substance carrying a layer structure of the second DBR stack, and a supporting on top of said layer structure.

22. The method according to claim 21, wherein the second DBR stack is coupled to the structured surface of the spacer by applying a wafer fusion between the surface of the supporting structure of the second DBR structure and the structured surface of the spacer.

23. The method according to claim 22, wherein the fusion is performed at 650° C. by applying a pressure of 2 bar to the fused interface.

24. The method according to claim 23, wherein said selective material removal comprises selectively etching the GaAs-substrate in a $H_2O_2$—$NH_3OH$ solution till reaching the first AlGaAs layer of the second DBR layer structure, said first layer acting as an etch-stop layer.

25. The method according to claim 24, comprising selectively etching said etch-stop layer in a HF—$H_2O$ solution.

26. The method according to claim 21, wherein said selective material removal comprising etching the mesa in the second DBR structure by dry etching in $Cl_2$—$CH_4$—Ar and selective chemical etching in a HF—$H_2O$ solution.

27. The method according to claim 26, wherein said etching of mesa continues until an etch stop-layer in the second DBR structure is reached, thus presenting an interface between a support structure for supporting the DBR stack in the second DBR structure.

28. The method according to claim 3, comprising formation of an active cavity material between the first DBR stack and the spacer.

29. The method according to claim 28, wherein the formation of the active cavity material comprises the steps of growing a multiquantum well layer stack sandwiched between two cladding layers.

30. The method according to claim 28, wherein said active cavity material is fused to the surface of the first DBR stack.

31. The method according to claim 28, wherein said first DBR stack is AlGaAs/GaAs, and said active cavity material comprises a multiquantum well InGaAsP/InGaAs layer stack sandwiched between two InP cladding layers.

32. The method according to claim 31, wherein said spacer comprises a InP layer with alternating p-n-p-n doping sandwiched between 2 InGaAsP etch-stop layers.

33. The method according to claim 28, wherein said mesa on the bottom of the recess is centered about the central vertical axis passing through the center of the recess.

34. The method according to claim 33, wherein said mesa on the bottom of the recess has a lateral size and a height of less than 10 and less than $\frac{1}{30}$, respectively, of a certain wavelength selected as an operational wavelength of the device.

* * * * *